United States Patent [19]
Oppenheim et al.

[11] Patent Number: 5,293,425
[45] Date of Patent: Mar. 8, 1994

[54] ACTIVE NOISE REDUCING

[75] Inventors: Alan V. Oppenheim, Lexington, Mass.; Ehud Weinstein, Rumat-Gan, Israel; Kambiz C. Zangi, Cambridge, Mass.; Meir Feder, Herzilia, Israel

[73] Assignee: Massachusetts Institute of Technology, Cambridge, Mass.

[21] Appl. No.: 802,121

[22] Filed: Dec. 3, 1991

[51] Int. Cl.$^5$ ............................................. G10K 11/16
[52] U.S. Cl. ....................................................... 381/71
[58] Field of Search ....................................... 381/71, 94

[56] References Cited

U.S. PATENT DOCUMENTS

| | | | |
|---|---|---|---|
| 4,589,133 | 5/1986 | Swinbanks | 381/71 |
| 4,783,817 | 11/1988 | Hamada et al. | 381/71 |
| 4,876,722 | 10/1989 | Dekker et al. | 381/71 |
| 5,022,082 | 6/1991 | Eriksson et al. | 381/71 |
| 5,033,082 | 7/1991 | Eriksson et al. | 381/71 |
| 5,117,642 | 6/1992 | Nakanishi et al. | 381/71 |

OTHER PUBLICATIONS

Signal Enhancement Using Single and Multi-Sensor Measurements, RLE Technical Report No. 560, E. Weinstein, A. V. Oppenheim and M. Feder, Published Dec. 7, 1990.

*Primary Examiner*—Forester W. Isen
*Attorney, Agent, or Firm*—Fish & Richardson

[57] ABSTRACT

A noise reducing system includes an input transducer that energizes an adaptive filter. The adaptive filter energizes an output transducer that creates a noise reducing field at the input transducer.

13 Claims, 7 Drawing Sheets

ACTIVE NOISE REDUCING

This invention was made with government support under Contract Number AFOSR-91-0034 awarded by the Department of the Air Force, Contract Number N00014-89-J-1489 awarded by the Department of the Navy and under Contract Number MDA904-89-C-3009 awarded by the Maryland Procurement office. The government has certain rights in the invention.

The present invention relates in general to active noise reducing and more particularly concerns novel apparatus and techniques for actively reducing noise using a pickup and secondary noise source in a stable system.

Unwanted acoustic noise is a by-product of many industrial processes and systems. With active noise reduction (ANR), one introduces a secondary noise source to generate an acoustic field that interferes destructively with the unwanted noise, and thereby attenuates it.

A conventional ANR system consists of an input microphone, adaptive filter, cancelling speaker, and an error microphone. The error microphone measures the residual acoustic field that is used to adjust the filter coefficients. The input microphone measures the unwanted noise at a point away from the error microphone. Performance of this ANR system is often hampered by acoustic feedback between the cancelling speaker and the input microphone. A pole-zero adaptive filter may be used to compensate for this feedback. However, it has been observed that there are instances when an ANR system based on this approach becomes unstable. Furthermore, the resulting algorithms have many restrictions, and consequently do not seem to be well suited for general purpose noise reduction.

According to the invention, an input transducer, such as a microphone, provides a transduced input signal representative of the noise field at the input transducer. A signal processor processes this transduced input signal to provide a predicted signal representative of future values of the noise field. This predicted signal energizes a noise cancelling source that provides a noise reducing signal that generates an acoustic field substantially equal in magnitude and of opposite phase to the predicted values of the noise field. Preferably, the signal processor models the noise field at any point as a stochastic process and processes the transduced input signal in accordance with an estimate-maximize algorithm (EM) to provide an estimated signal adaptively representative of the characteristics of this process. The processor further processes the estimated signal to provide a predicted signal representative of future values of the noise field. A feature of the invention is the use of the input transducer and noise reducing source in a system free from acoustic feedback that supports oscillation.

Preferably, the EM algorithm is a time-domain formulation corresponding to iteratively applying a Kalman smoother to data signal blocks, preferably using a Kalman filter and time index to provide a sequential algorithm signal. Preferably, the processor exponentially weighs the algorithm signal so that the active noise reducing system is essentially completely adaptive and may be used for reducing stationary and nonstationary noise.

A detailed explanation of principles of operation is in the appended paper entitled "Single-Sensor Active Noise Cancellation Based on the EM Algorithm" by Alan V. Oppenheim, Ehud Weinstein, Kambiz C. Zangi, Meir Feder and Dan Gauger, the first four authors being the inventors in this application.

Other features, objects and advantages of the invention will become apparent from the following detailed description when read in connection with the accompanying drawings in which:

Figure 1:
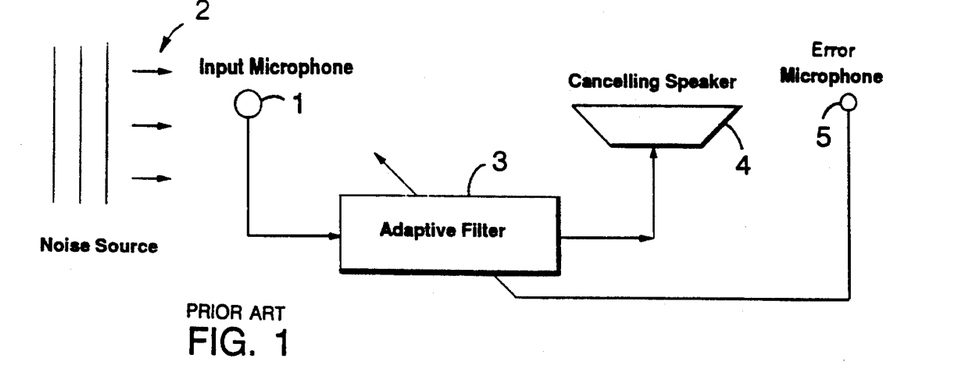
FIG. 1 is a block diagram illustrating the logical arrangement of a prior art active noise reducing system.

With reference now to the drawing and more particularly FIG. 1 thereof, there is shown a diagram illustrating the logical arrangement of a prior art active noise reducing system. This system typically includes an input microphone 1, that receives noise from a noise source 2 and energizes an adaptive filter 3 that energizes a cancelling speaker 4 to provide a noise reducing signal. The system also includes an error microphone 5 that provides a signal to a control input of adaptive filter 3 that adjusts filter coefficients in accordance with the residual acoustic field transduced by error microphone 5. A disadvantage of this system is acoustic feedback between cancelling speaker 4 and input microphone 1 that may support oscillations.

Figure 2:
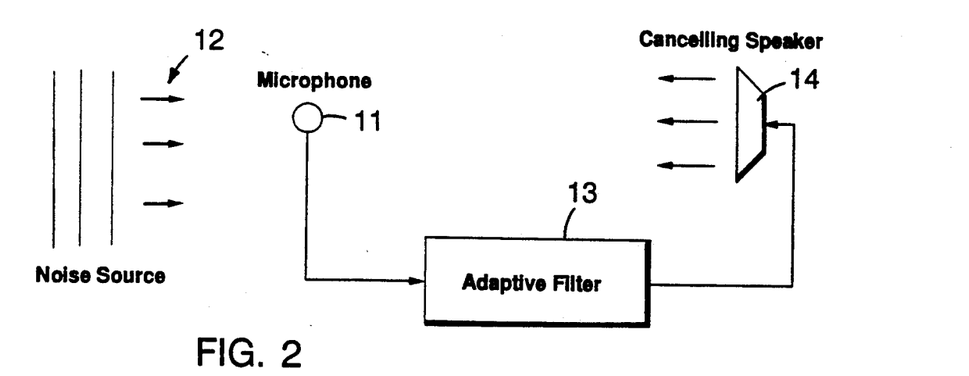
FIG. 2 is a block diagram of the logical arrangement of a system according to the invention.

Referring to FIG. 2, there is shown a block diagram illustrating the logical arrangement of an active noise reducing system according to the invention free of feedback that may support oscillation. The system includes a microphone 11 comprising the input transducer that receives noise energy from a noise source 12 to provide a transduced input signal characteristic of the noise from noise source 12 to adaptive filter 13. Adaptive filter 13 processes the transduced signal to provide a noise reducing output signal at its output that is applied to noise reducing output transducer 14, typically a loudspeaker, to provide a signal of phase and amplitude that reduces the noise field sensed by input transducer 11.

Figure 3:
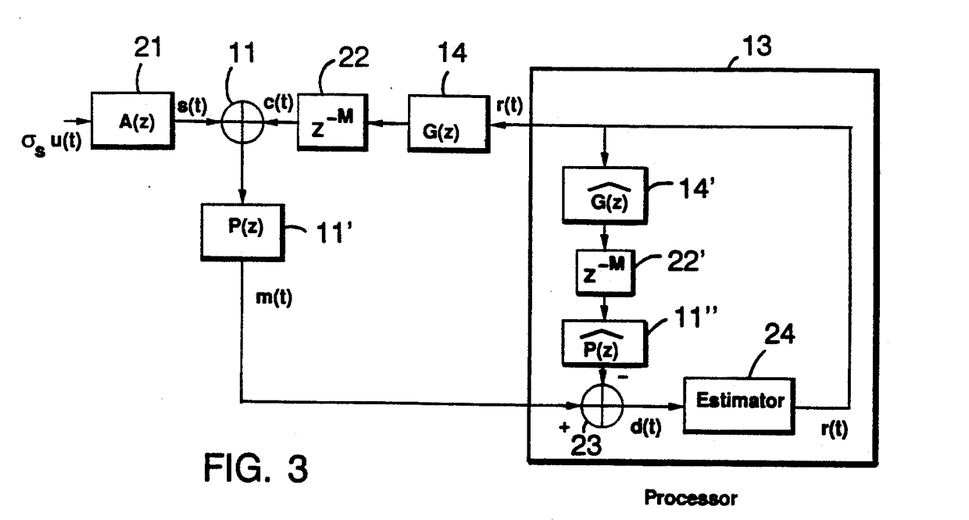
FIG. 3 is a block diagram illustrating components in a specific embodiment of the invention.

Referring to FIG. 3, there is shown a block diagram helpful in understanding the operation of the system of FIG. 2. The noise signal to be reduced is represented as a result of a stochastic process representable as a white noise signal $\sigma_s U(t)$ applied to a filter 21 having a transfer characteristic A(z). Adaptive filter 13 provides the noise reducing signal r(t) to output transducer 14 having a transfer characteristic G(z) with the medium 22 between output transducer 14 and input transducer 11 furnishing a delay $Z^M$ with c(t) representing the noise reducing signal furnished to input transducer 11. Input transducer 11 includes transducing elements 11' characterized by a transfer characteristic P(z) to provide a transduced input signal m(t) to the input of adaptive filter 13. Adaptive filter 13 includes in a feedback path output transducer simulating filter 14' having a transfer characteristic approximating or equal to the transfer characteristic G(z) of output transducer 14, a delay circuit 22' furnishing a delay the same or approximately that furnished by medium 22 and signal processor 11'' having a transfer characteristic the same or approximately equal to P(z) associated with microphone 11. Signal combiner 23 combines the signals provided by microphone 11' and signal processor 11'' to provide a signal d(t) to estimator 24 representative of the difference between the output signal r(t) provided by estimator 24 and the signal s(t) at the input of input transducer 11.

Figure 4:
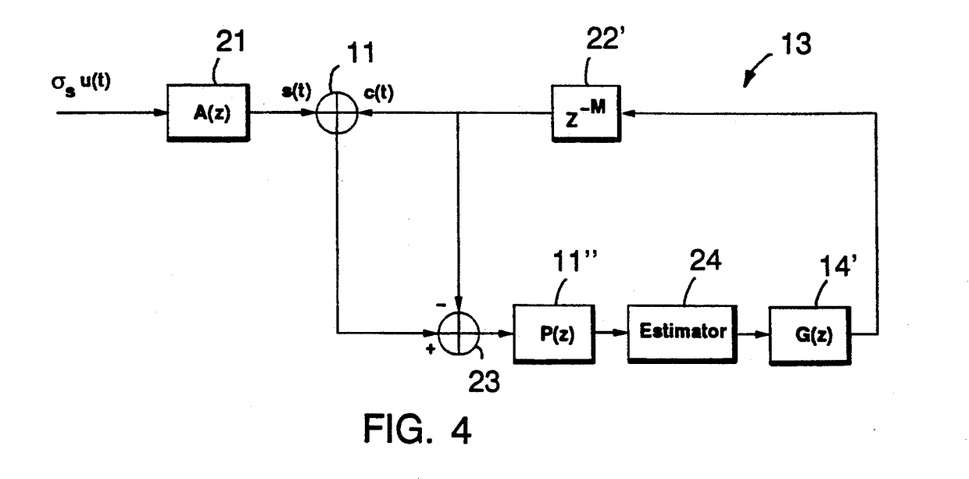
FIG. 4 is a block diagram illustrating a simplified system according to the invention.

If the transfer characteristics P(z) and G(z) are known and invertible, then the block diagram in FIG. 3 may be redrawn as shown in FIG. 4. Under ideal conditions estimator 24 comprises circuitry for inverting the transfer functions P(z) and G(z) followed by an M-sample prediction to compensate for the M-sample delay. With the transfer characteristics P(z) and G(z) known and invertible, the invention effects noise reduction by furnishing a signal that compensates for the delay between the output and input transducers to predict the properties of the noise reducing signal.

Figure 5:
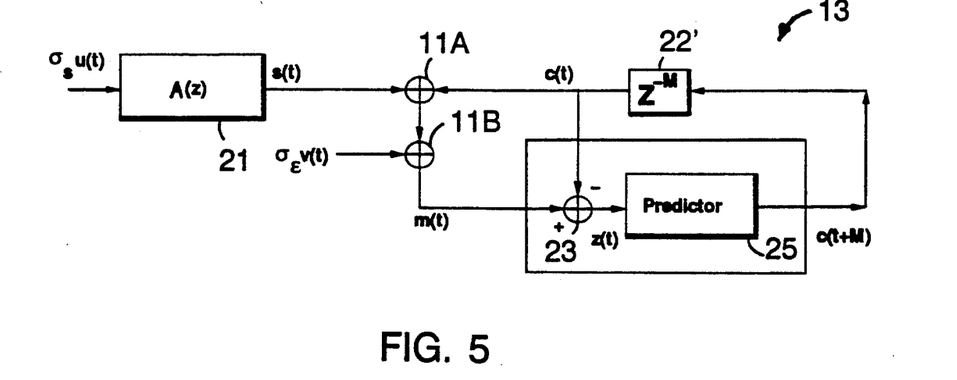
FIG. 5 is a block diagram illustrating the logical arrangement of a system according to the invention helpful in understanding the mode of operations.

Referring to FIG. 5, there is shown a block diagram illustrating the logical arrangement of a system according to the invention corresponding substantially to that of FIG. 4 helpful in understanding the principles of operation. It is convenient to consider input transducer 11 as comprising a first combiner 11A that receives the signals s(t) and c(t) that provides a difference signal to a second combiner 11B that receives a noise signal $\sigma_\epsilon$ V(t) characteristic of the measurement error of input transducer 11 to provide the transduced input signal m(t) at the input of adaptive filter 13.

It is convenient to assume that the input noise signal s(t) may be represented as an autoregressive process signal of the form represented in equation (1) on page 4 of the appended paper and the signals u(t) and v(t) are unit variance white noise and the delay M is known, and the parameters $\sigma_s$ and $\alpha_\epsilon$ are unknown. By adjusting variable coefficients $\alpha_1, \ldots, \alpha_p$ that characterize adaptive filter 13, the invention effects active noise reduction. The invention estimates the parameters and the signal s(t) through processing in accordance with an adaptive algorithm based on the estimate-maximize (EM) algorithm for maximum likelihood estimation described in papers [4] and [6] on page 43 of the appended paper. These estimated parameters and the estimated signal are then used by predictor 25 to predict the contemporary value of the noise signal s(t) to provide as an output the signal c(t+M) that is applied to delay unit 22' to provide the cancelling signal c(t) at the input of input transducer 11. The principles of operation for developing the signal c(t+M) from predictor 25 are fully described in section 3 of the appended paper on pages 7-10 and in the appendix of that paper on pages 41 and 42. FIG. 5 of the paper corresponds to FIG. 5.

Figure 6:
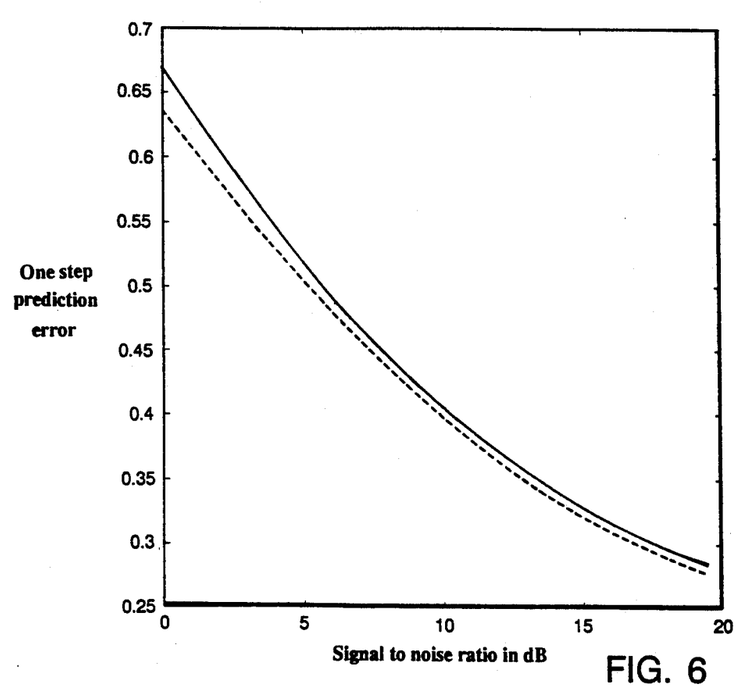
FIGS. 6–8 are graphical representations of experimental measurements of prediction error as a function of signal-to-noise ratio for three different autoregressive systems.
Figure 7:
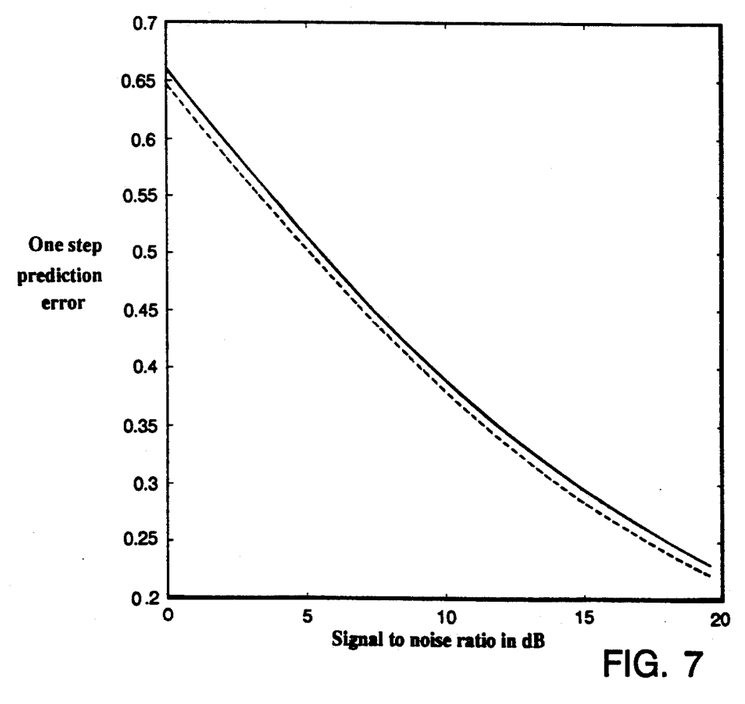
Figure 8:
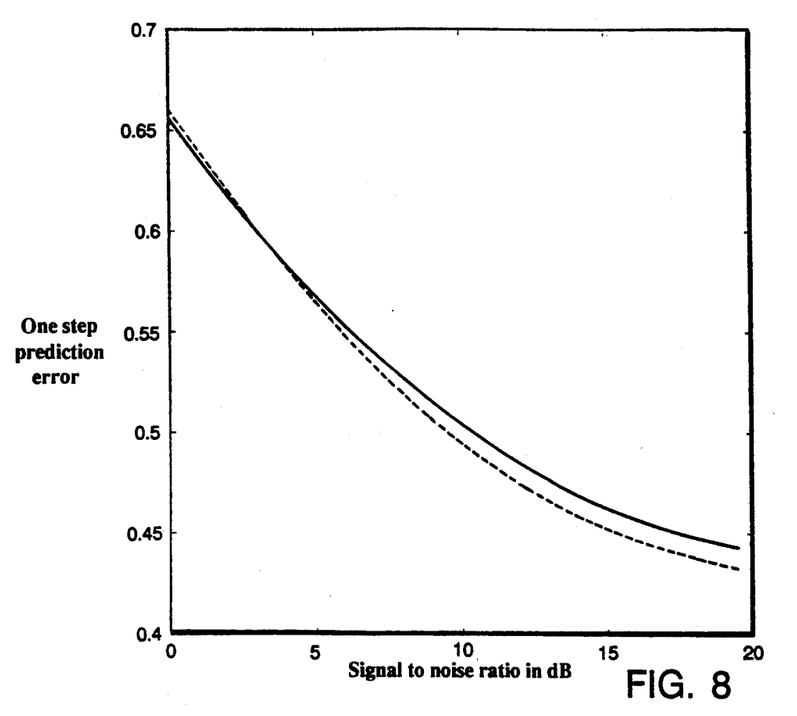

Referring to FIGS. 6-8, there are shown graphical representations of prediction error as a function of signal- to-noise ratio for three different functions A(z) of auto regressive system 21 furnishing the noise signal s(t) to be reduced each experiment involved measuring the prediction error power for s(t) as defined by equation (97) on page 21 of the appended paper at various signal-to-noise ratios, the measurement noise was stationary, the correct value of $\sigma_\epsilon$ was assumed to be known, the forgetting factors were set equal to 1, and the other system parameters estimated. FIGS. 6-8 correspond to FIGS. 6-8, respectively, of the appended paper.

The dotted line in FIGS. 6-8 is the average prediction error of a Kalman predictor which uses the correct system parameters and is the optimum predictor in the sense that no other predictor can achieve a lower average prediction error. The solid line in FIGS. 6-8 is the average prediction error using the algorithm in section 3 of the appended paper. For the three cases, the system functions A(z) in FIG. 5 for FIGS. 6-8 corresponded to H(z) in FIG. 5 of the aforesaid paper, and for FIGS. 7-9, respectively, in equations (99) on page 22 of the appended paper. These results indicate that a limiting factor in reducing the prediction error is the white component of the noise signal s(t), whose variance is $\sigma_s^2$. For a given signal-to-noise ratio as the correlation time of the noise signal s(t) increases, the corresponding value of the variance $\sigma_s$ decreases so that processing in accordance with the algorithm of section 3 of the appended paper works better when the noise signal s(t) has a longer correlation time.

Figure 9:
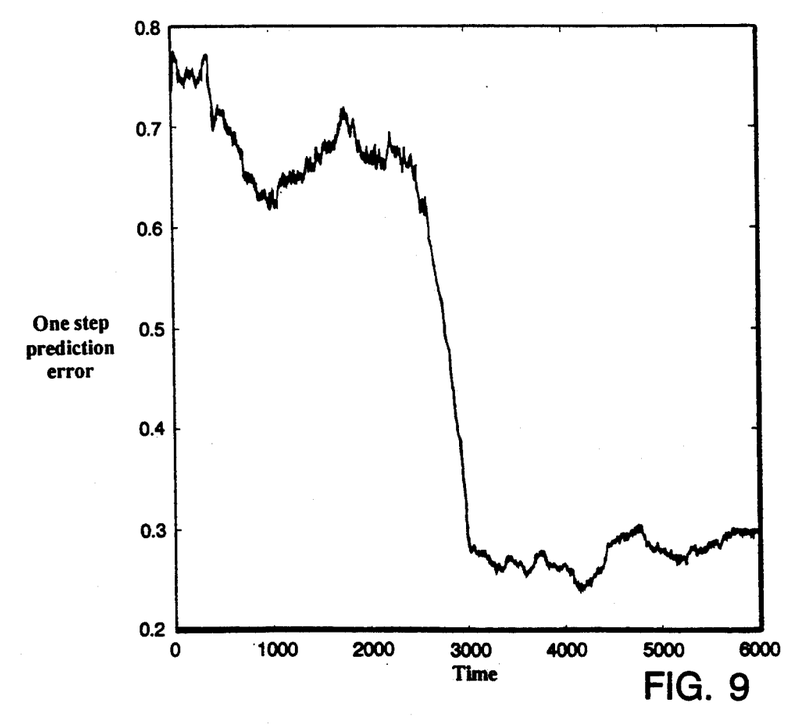
FIGS. 9 and 10 are graphical representations of experimental determinations of prediction error as a function of time for two different system functions.
Figure 10:
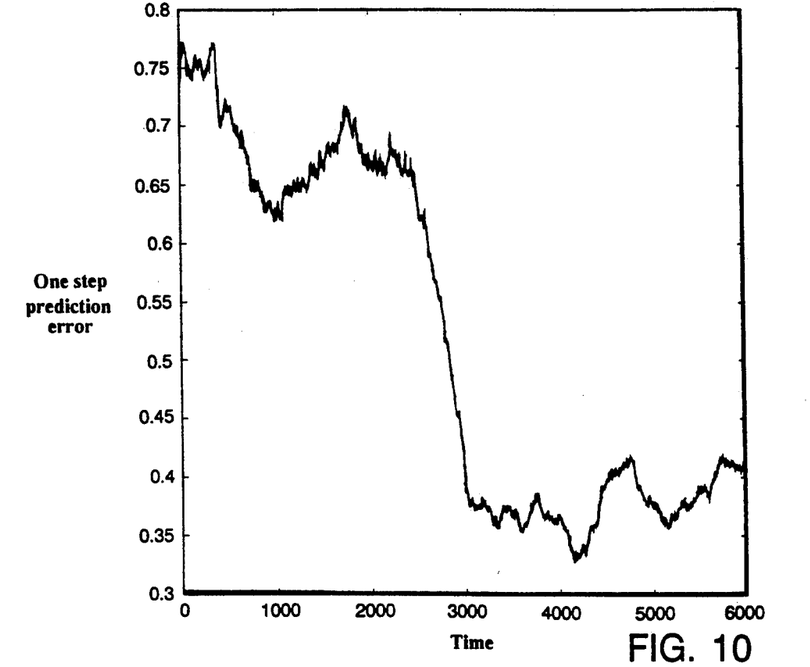

Referring to FIGS. 9 and 10, there are shown graphical representations of prediction error as a function of time for experiments in which the autoregressive transfer function A(z) of system 21 was abruptly changed at times equal to 600, and the prediction error measured through 6000. A smoothing filter processed the measured prediction error data signals to provide the graphical representations of FIGS. 9 and 10. In both cases, the correct value of $\sigma_\epsilon$ was assumed to be known, and all the $\sigma$ forgetting factors defined on page 16 of the appended paper were set equal to 0.975. The signal-to-noise ratio, as defined in equation (100) on page 23 of the appended paper was equal to 20 dB in both experiments with the system functions A(z) corresponding to the system functions H(z).

The transfer characteristic of autoregressive system 21 resulting in the graphical representation in FIG. 9 for 2000 through 6000 is the same as that resulting in the graphical representation in FIG. 6. FIG. 6 shows that the standard deviation of the steady-state prediction error at 20dB signal-to-noise ratio processing with the nonadaptive algorithm with stationary noise is about 0.28. FIG. 8 shows that it takes about 400 samples for the processing with the adaptive algorithm to adapt to the new autoregressive system 21 parameters, and the standard deviation of the prediction error after this adaption occurs is approximately 0.3. Thus, after an adaptation time of about 400 samples, the performance of processing with the adaptive algorithm is approximately equal to steady state processing performance with the nonadaptive algorithm.

Figure 11:
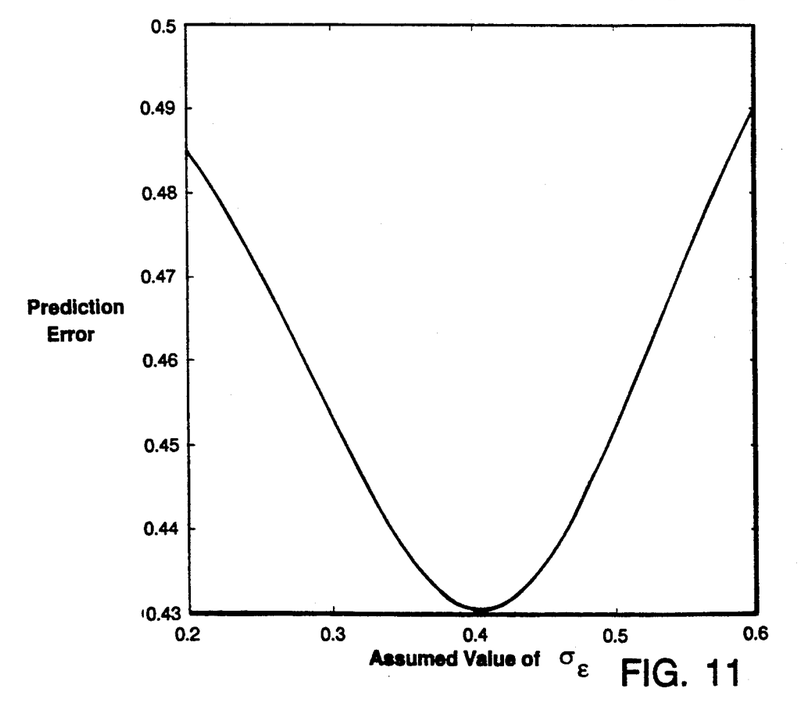
FIGS. 11 and 12 are graphical representations of prediction error as a function of assumed value of $\sigma_\epsilon$.
Figure 12:
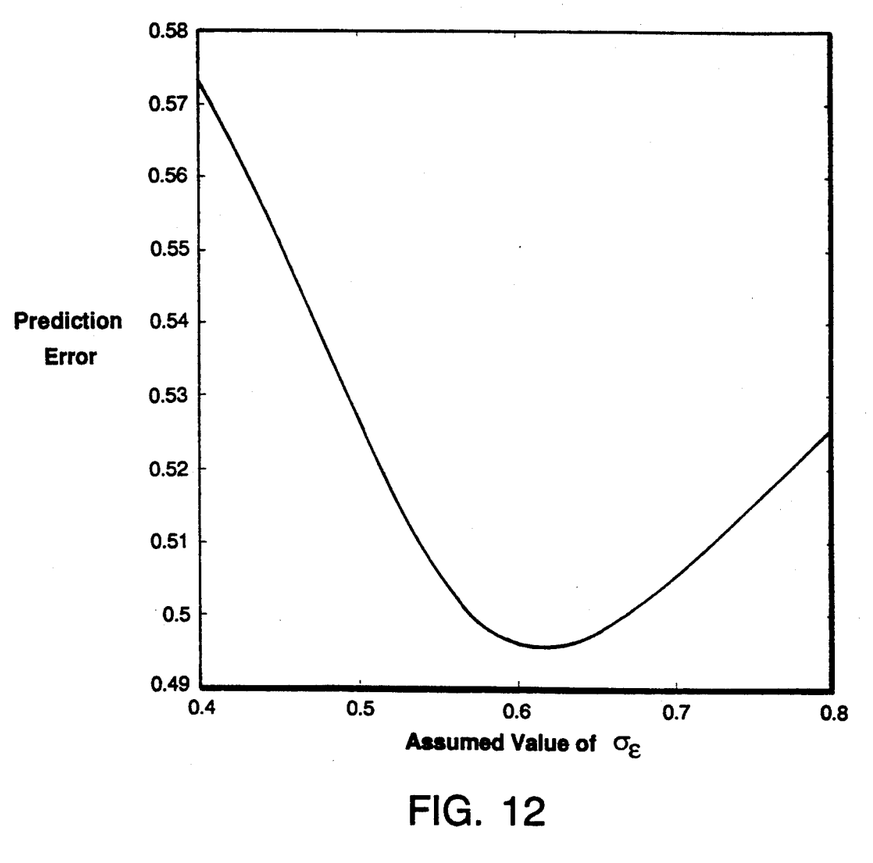

Referring to FIGS. 11 and 12, there is shown a graphical representation of prediction error as a function of assumed value of $\sigma_\epsilon$. For these experiments the autoregressive system 21 was a third-order all-pole system with a specific fixed value of $\sigma_\epsilon$. FIG. 11 shows the average prediction error as a function of assumed value of $\sigma_\epsilon$ with the actual value of $\sigma_\epsilon$ fixed at 0.4 and FIG. 12 for a true value of $\sigma_\epsilon$ at 0.6 with A(z) corresponding to equation (101) on page 24 of the appended paper.

These experiments show that the average prediction error is a concave function of $\sigma_\epsilon$ with the minimum occurring at the actual value so that processing in accordance with a simple "hill climbing" algorithm may be used to determine a preferred estimated choice of $\sigma_\epsilon$.

Figures 13, 14:
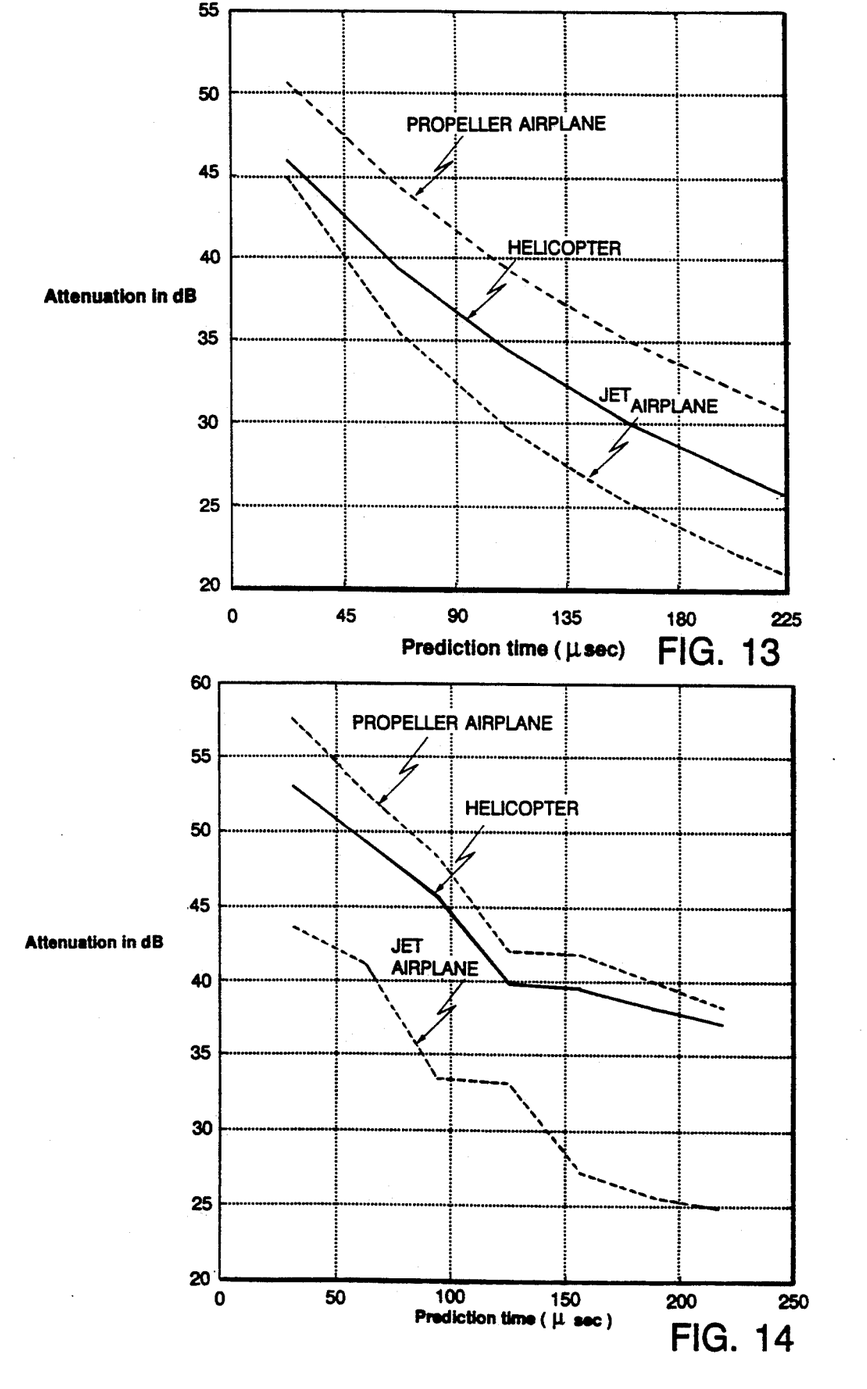
FIGS. 13 and 14 are graphical representations of attenuation as a function of prediction time for noise generated by three types of aircraft for different algorithms used in processing to provide the noise reducing signal.

Referring to FIG. 13, there is shown a graphical representation of noise attenuation obtained with a simulation of the invention for a King Air propeller aircraft, Bell Helicopter and F15 jet airplane. These recordings were made from a microphone placed inside a set of headphones approximately two meters away from each aircraft. The order of the transfer characteristic H(z) was assumed to be seven, and $\sigma_\epsilon$ was fixed at 5% of the standard deviation of the unwanted noise.

Prediction time is dependent on the spacing between the reducing output transducer and the input transducer. In the simulations, one-step prediction corresponds to a spacing of 0.625 cm between the output and input transducers and a prediction time of 0.225 $\mu$sec. The attenuation is in accordance with equation (103) on page 25 of the appended paper.

Referring to FIG. 14, there is shown a graphical representation of attenuation as a function of prediction time for the same noise sources represented in FIG. 13 but processed in accordance with the gradient-based algorithm described in section 6 on pages 26-31 of the appended paper.

Other embodiments are within the claims.

What is claimed is:

1. Active noise reducing apparatus comprising,
   an input transducer that provides a transduced input signal,
   an adaptive filter having an input coupled to said input transducer,
   an output transducer coupled to the output of said adaptive filter that transducer the signal on said adaptive filter output to provide a transduced signal to create a noise reducing field at said input transducer,
   said apparatus being free of acoustic feedback between said output transducer and said input transducer that supports oscillatory signals in said apparatus that impairs active noise reduction,
   said apparatus being free of any other input transducer capble of providing a transduced input signal to said adaptive filter,
   wherein said adaptive filter processes the signal on its input in accordance with a predictive algorithm so that said noise reducing field is of nearly equal magnitude and opposite phase relative to the noise field then at said input transducer in the absence of said noise reducing field.

2. Active noise reducing apparatus in accordance with claim 1 wherein said input transducer comprises a microphone and said output transducer comprises a loudspeaker driver.

3. Active noise reducing apparatus in accordance with claim 1 wherein said adaptive filter processes said transduced input signal in accordance with an estimate-maximize algorithm.

4. Active noise reducing apparatus in accordance with claim 1 wherein said adaptive filter processes said transduced input signal in accordance with a gradient-based algorithm.

5. Active noise reducing apparatus in accordance with claim 1 wherein said adaptive filter includes an estimator having an input and an output that provides said transduced signal,
   a combiner having first and second inputs and an output coupled to the input of said estimator,
   said first input being said input of said adaptive filter,
   and feedback circuitry intercoupling said second input and the output of said estimator.

6. Active noise reducing apparatus in accordance with claim 1 wherein said adaptive filter includes an estimator having an input and an output that provides said transduced signal,
   a combiner having first and second inputs and an output coupled to the input of said estimator,
   said first input being said input of said adaptive filter,
   and feedback circuitry intercoupling said second input and the output of said estimator.

7. Active noise reducing apparatus in accordance with claim 5 wherein said adaptive filter processes said transduced input signal in accordance with an estimate-maximize algorithm.

8. Active noise reducing apparatus in accordance with claim 6 wherein said adaptive filter processes said transduced input signal in accordance with an estimate-maximize algorithm.

9. Active noise reducing apparatus in accordance with claim 5 wherein said adaptive filter processes said transduced input signal in accordance with a gradient-based algorithm.

10. Active noise reducing apparatus in accordance with claim 6 wherein said adaptive filter processes said transduced input signal in accordance with a gradient-based algorithm.

11. A method of active noise reducing which method includes the steps of,
    transducing with a single input transducer a sound field including a noise field at a first location to provide a transduced input signal,
    adaptively filtering only said transduced input signal to provide a noise reducing electrical signal,
    transducing said noise reducing electrical signal to provide a transduced noise-reducing signal at a second location to create a noise-reducing field at said first location,
    and preventing acoustic feedback between said second location and said first location that supports oscillatory signals that impairs active noise reduction,
    and further including adaptively filtering said transduced input signal in accordance with a predictive algorithm so that said noise reducing field is of nearly equal magnitude and opposite phase relative to the noise field then at said first location in the absence of said noise reducing field.

12. A method of active noise reducing in accordance with claim 11 wherein the step of adaptively filtering said transduced input signal in accordance with a predictive algorithm includes adaptively filtering said transduced input signal in accordance with a gradient-based algorithm.

13. A method of active noise reducing in accordance with claim 11 wherein the step of adaptively filtering said transduced input signal in accordance with a predictive algorithm includes adaptively filtering said transduced input signal in accordance with an estimate-maximize algorithm.

* * * * *